(12) United States Patent
Liu et al.

(10) Patent No.: US 11,024,695 B2
(45) Date of Patent: Jun. 1, 2021

(54) DISPLAY PANEL AND DISPLAY APPARATUS INCLUDING THE SAME

(71) Applicant: Shanghai Tianma AM-OLED Co., Ltd., Shanghai (CN)

(72) Inventors: Haimin Liu, Shanghai (CN); Zhiyong Xiong, Shanghai (CN); Liujing Fan, Shanghai (CN)

(73) Assignee: Shanghai Tianma AM-OLED Co., Ltd., Shanghai (CN)

( * ) Notice: Subject to any disclaimer, the term of this patent is extended or adjusted under 35 U.S.C. 154(b) by 0 days.

(21) Appl. No.: 16/671,543

(22) Filed: Nov. 1, 2019

(65) Prior Publication Data
US 2020/0373371 A1 Nov. 26, 2020

(30) Foreign Application Priority Data
May 21, 2019 (CN) .......................... 201910427508.2

(51) Int. Cl.
*H01L 27/32* (2006.01)
*H01L 51/52* (2006.01)
(Continued)

(52) U.S. Cl.
CPC ........ *H01L 27/3272* (2013.01); *H01L 27/124* (2013.01); *H01L 27/1244* (2013.01);
(Continued)

(58) Field of Classification Search
CPC . H01L 27/323; H01L 27/124; H01L 27/1244; H01L 27/3246; H01L 27/3276; H01L 23/60; H01L 2251/5338; H01L 2251/56; H01L 2251/562; H01L 51/0097; H01L 51/50; H01L 51/5246; H01L 51/525; H01L 51/5253; H01L 51/56; G09G 2300/04; G09G 2300/0421;
(Continued)

(56) References Cited

U.S. PATENT DOCUMENTS

| 5,847,690 A | * | 12/1998 | Boie | ..................... G06F 3/0412 345/104 |
| 6,624,857 B1 | * | 9/2003 | Nagata | ................. G02F 1/1309 349/139 |

(Continued)

FOREIGN PATENT DOCUMENTS

CN 205691902 U 11/2016

*Primary Examiner* — Maliheh Malek
(74) *Attorney, Agent, or Firm* — Christensen O'Connor Johnson Kindness PLLC (57) ABSTRACT

A display panel and a display apparatus are provided. The display panel includes a display region and a non-display region surrounding the display region. The non-display region includes a step region, a left border and a right border that are adjacent to the step region, and an upper border arranged opposite to the step region. The left border, the right border, the upper border, and the step region surround the display region. The left border and the right border each include an encapsulation region. The encapsulation region includes a sealant and a reflective metal layer that are at least partially overlapped with each other. The step region includes a ground metal line, and the ground metal line is connected to the reflective metal layer through an electrostatic consumption resistance portion.

16 Claims, 8 Drawing Sheets

(51) Int. Cl.
　　　*H01L 27/12*　　　(2006.01)
　　　*G09G 3/32*　　　(2016.01)
(52) U.S. Cl.
　　　CPC ...... *H01L 27/3246* (2013.01); *H01L 27/3258* (2013.01); *H01L 27/3262* (2013.01); *H01L 27/3265* (2013.01); *H01L 27/3276* (2013.01); *H01L 51/5246* (2013.01)
(58) Field of Classification Search
　　　CPC ... G09G 2300/0426; G09G 2300/0469; G09G 2300/0478; G09G 2310/0232; G09G 2320/0209; G09G 2320/08; G09G 2330/02; G09G 2330/04; G09G 2330/06
　　　See application file for complete search history.

(56) References Cited

U.S. PATENT DOCUMENTS

| | | | | |
|---|---|---|---|---|
| 6,879,096 | B1* | 4/2005 | Miyazaki | G09G 3/2011 313/292 |
| 9,704,435 | B2* | 7/2017 | Chen | G09G 3/3258 |
| 10,401,997 | B2* | 9/2019 | Lin | H01L 27/124 |
| 10,403,212 | B2* | 9/2019 | Chen | G09G 3/3291 |
| 10,409,121 | B2* | 9/2019 | Peng | G02F 1/1368 |
| 10,613,398 | B2* | 4/2020 | Lin | G02F 1/136204 |
| 2005/0213173 | A1* | 9/2005 | Sasaki | G06K 9/0004 358/514 |
| 2005/0270273 | A1* | 12/2005 | Marten | G06F 3/044 345/173 |
| 2007/0292666 | A1* | 12/2007 | Higashino | H05K 9/0067 428/208 |
| 2008/0296576 | A1* | 12/2008 | Uchida | H01L 27/13 257/59 |
| 2011/0242017 | A1* | 10/2011 | Kang | G06F 3/045 345/173 |
| 2013/0044074 | A1* | 2/2013 | Park | G02F 1/1362 345/174 |
| 2013/0293508 | A1* | 11/2013 | Lin | G06F 3/044 345/174 |
| 2014/0138141 | A1* | 5/2014 | Li | H05K 1/0259 174/261 |
| 2014/0183528 | A1* | 7/2014 | Endo | H01L 27/1225 257/43 |
| 2014/0313446 | A1* | 10/2014 | Kubota | G02F 1/1368 349/43 |
| 2014/0319528 | A1* | 10/2014 | Kesho | H01L 27/3276 257/59 |
| 2015/0092306 | A1* | 4/2015 | Hou | H01L 27/0296 361/42 |
| 2015/0115271 | A1 | 4/2015 | Yoon et al. | |
| 2015/0194109 | A1* | 7/2015 | Fujikawa | G02F 1/1309 345/100 |
| 2015/0235913 | A1* | 8/2015 | In | G09G 3/006 257/48 |
| 2015/0372072 | A1* | 12/2015 | Xiong | H01L 27/3279 257/40 |
| 2016/0019826 | A1* | 1/2016 | Kim | G09G 3/20 345/214 |
| 2016/0104413 | A1* | 4/2016 | Matsueda | H01L 27/3218 345/694 |
| 2016/0105951 | A1* | 4/2016 | Lee | H05K 1/111 361/751 |
| 2016/0124550 | A1* | 5/2016 | Tada | H05K 1/117 345/173 |
| 2016/0147346 | A1* | 5/2016 | Lee | G06F 3/0412 345/173 |
| 2016/0197610 | A1* | 7/2016 | Lee | G06F 1/16 345/174 |
| 2016/0291780 | A1* | 10/2016 | Namkung | G06F 3/044 |
| 2016/0306487 | A1* | 10/2016 | Jeong | G06F 3/044 |
| 2016/0327841 | A1* | 11/2016 | Jia | G02F 1/136209 |
| 2017/0126176 | A1* | 5/2017 | Okamoto | H03B 5/06 |
| 2017/0154943 | A1* | 6/2017 | Yang | H01L 27/3276 |
| 2017/0244061 | A1* | 8/2017 | Jin | H01L 51/5237 |
| 2018/0006097 | A1* | 1/2018 | Xiong | H01L 27/3248 |
| 2018/0053790 | A1* | 2/2018 | Kwon | H01L 27/1222 |
| 2018/0059821 | A1* | 3/2018 | Wu | H01L 23/60 |
| 2018/0097051 | A1* | 4/2018 | Huang | H01L 51/56 |
| 2018/0108683 | A1* | 4/2018 | Jeon | H01L 27/1255 |
| 2018/0157359 | A1* | 6/2018 | Lin | H01L 27/1225 |
| 2018/0188568 | A1* | 7/2018 | Kim | G02F 1/136204 |
| 2018/0190190 | A1* | 7/2018 | Xi | G09G 3/3208 |
| 2018/0261631 | A1* | 9/2018 | Oda | G02F 1/13439 |
| 2018/0299779 | A1* | 10/2018 | Holt | G03F 7/033 |
| 2019/0027076 | A1* | 1/2019 | Lee | H01L 51/5253 |
| 2019/0036073 | A1* | 1/2019 | Yu | H01L 51/5281 |
| 2019/0051708 | A1* | 2/2019 | Jeong | H01L 27/3223 |
| 2019/0064613 | A1* | 2/2019 | Lin | G02F 1/136204 |
| 2019/0066595 | A1* | 2/2019 | Kim | G09G 3/006 |
| 2019/0131527 | A1* | 5/2019 | Bang | H01L 51/56 |
| 2019/0164954 | A1* | 5/2019 | Yang | H01L 27/124 |
| 2019/0173059 | A1* | 6/2019 | Liu | C23C 14/042 |
| 2019/0196280 | A1* | 6/2019 | Guo | H01L 27/1288 |
| 2019/0229530 | A1* | 7/2019 | Xu | H01L 27/0296 |
| 2019/0257875 | A1* | 8/2019 | Hao | H01L 27/0288 |
| 2019/0294281 | A1* | 9/2019 | Kim | G06F 3/0412 |
| 2019/0312098 | A1* | 10/2019 | Matsueda | G09G 3/3266 |
| 2019/0312099 | A1* | 10/2019 | Matsueda | H01L 27/3276 |
| 2019/0319051 | A1* | 10/2019 | Lin | H01L 29/7869 |
| 2019/0348491 | A1* | 11/2019 | Chung | H01L 27/3276 |
| 2019/0372051 | A1* | 12/2019 | Kwon | H01L 51/5237 |
| 2019/0386230 | A1* | 12/2019 | Tang | H01L 27/3276 |
| 2020/0127238 | A1* | 4/2020 | Ye | H01L 27/323 |
| 2020/0135833 | A1* | 4/2020 | Ma | G09G 3/3644 |
| 2020/0136066 | A1* | 4/2020 | Jin | H01L 27/3276 |
| 2020/0144351 | A1* | 5/2020 | Liu | H01L 51/5246 |
| 2020/0168155 | A1* | 5/2020 | Xiong | G09G 3/3233 |
| 2020/0168837 | A1* | 5/2020 | Liu | H01L 51/5271 |
| 2020/0185427 | A1* | 6/2020 | Fan | H01L 27/1255 |
| 2020/0185538 | A1* | 6/2020 | Yamazaki | G06F 3/0412 |
| 2020/0243562 | A1* | 7/2020 | Liu | G09G 3/2003 |
| 2020/0312209 | A1* | 10/2020 | Yang | G09G 3/20 |
| 2020/0410926 | A1* | 12/2020 | Li | G09G 3/3233 |
| 2020/0411561 | A1* | 12/2020 | Chang | H01L 27/124 |

* cited by examiner

DISPLAY PANEL AND DISPLAY APPARATUS INCLUDING THE SAME

CROSS-REFERENCE TO RELATED APPLICATIONS

The present application claims priority to Chinese Patent Application No. 201910427508.2, filed on May 21, 2019, the content of which is incorporated herein by reference in its entirety.

TECHNICAL FIELD

The present disclosure relates to the field of display technologies and, particularly, relates to a display panel and a display apparatus including the display panel.

BACKGROUND

An encapsulation region of a display panel is encapsulated with frit by laser melting. In order to improve the utilization of the laser and the uniformity of the melting of the frit, a frit metal (reflective metal layer) may be provided in the encapsulation region. Furthermore, in order to prevent static electricity from accumulating and thus damaging the frit in the reflective metal layer, the reflective metal layer is connected to a ground signal line to conduct static electricity. At present, there are more and more mobile phone products with R corners (rounded corners) and notches. In the case of silk screening the frit, the R corners and the notches are required to be processed by edging. Generally, in the R corner region, in order to provide space for a cut-out clearance region, it is required that the frit shall be spaced away from a cutting edge by a distance larger than 120 μm. In the design, the R corner region may shrink the frit inside the frit metal. Since the frit metal only have an inorganic insulation layer formed thereon for protection, the inorganic layer may be broken down when the static electricity hits a lower R corner region. The static electricity is conducted along the frit metal to the ground signal line, so that a test circuit region trace and a shift register circuit that are overlapped with the ground signal line may be damaged, causing display failure.

SUMMARY

The present disclosure provides a display panel and a display device including the display panel, in order to solve the above problems.

In a first aspect of the present disclosure, a display panel is provided. The display panel includes a display region and a non-display region surrounding the display region. The non-display region includes a step region, a left border and a right border that are adjacent to the step region, and an upper border arranged opposite to the step region. The left border, the right border, the upper border, and the step region surround the display region. The left border and the right border each include an encapsulation region. The encapsulation region includes a sealant and a reflective metal layer that are at least partially overlapped with each other. The step region includes a ground metal line, and the ground metal line is connected to the reflective metal layer through an electrostatic consumption resistance portion.

In a second aspect of the present disclosure, a display device is provided. The display device includes the display panel described as above.

BRIEF DESCRIPTION OF DRAWINGS

In order to better illustrate technical solutions of embodiments of the present disclosure, the accompanying drawings used in the embodiments are briefly described below. The drawings described below are merely a part of the embodiments of the present disclosure.

Based on these drawings, those skilled in the art can obtain other drawings.

DESCRIPTION OF EMBODIMENTS

In order to better understand technical solutions of the present disclosure, the embodiments of the present disclosure are described in detail with reference to the drawings.

It should be understood that the described embodiments are merely part of the embodiments of the present disclosure rather than all of the embodiments. All other embodiments obtained by those skilled in the art shall fall into the protection scope of the present disclosure.

The terms used in the embodiments of the present disclosure are merely for the purpose of describing specific embodiments, rather than limiting the present disclosure. The terms "a", "an", "the" and "said" in a singular form in the embodiments of the present disclosure and the attached claims are also intended to include plural forms thereof, unless noted otherwise.

It should be understood that the term "and/or" used in the context of the present disclosure is to describe a relation between related objects, indicating that there may be three relations, e.g., A and/or B may indicate only A, both A and B, and only B. In addition, the symbol "/" in the context generally indicates that the relation between the objects before and after the "/" is an "or" relationship.

It should be understood that although the terms 'first', 'second' and 'third' may be used in the present disclosure to describe electrostatic consumption resistance portions, these electrodes should not be limited to these terms. These terms are used only to distinguish the electrostatic consumption resistance portions from one another. For example, without departing from the scope of the embodiments of the present disclosure, a first electrostatic consumption resistance portion may also be referred to as a second electrostatic consumption resistance portion. Similarly, the second electrostatic consumption resistance portion may also be referred to as the first electrostatic consumption resistance portion.

As described in the background part, in order to avoid static electricity accumulation on an encapsulation metal layer, the encapsulation metal layer is required to be electrically connected to the ground signal line circuit to discharge the static electricity, thereby avoiding static electricity accumulation. However, when the inorganic layer on the encapsulation metal layer is broken down by a strong static electricity, it may be transmitted to the ground signal line through the encapsulation metal layer, while the ground signal line overlaps with the test circuit region. As a result, the static electricity may damage the test circuit. Therefore, the present disclosure provides a display panel and a display apparatus to solve the above technical problems.

Figure 1:
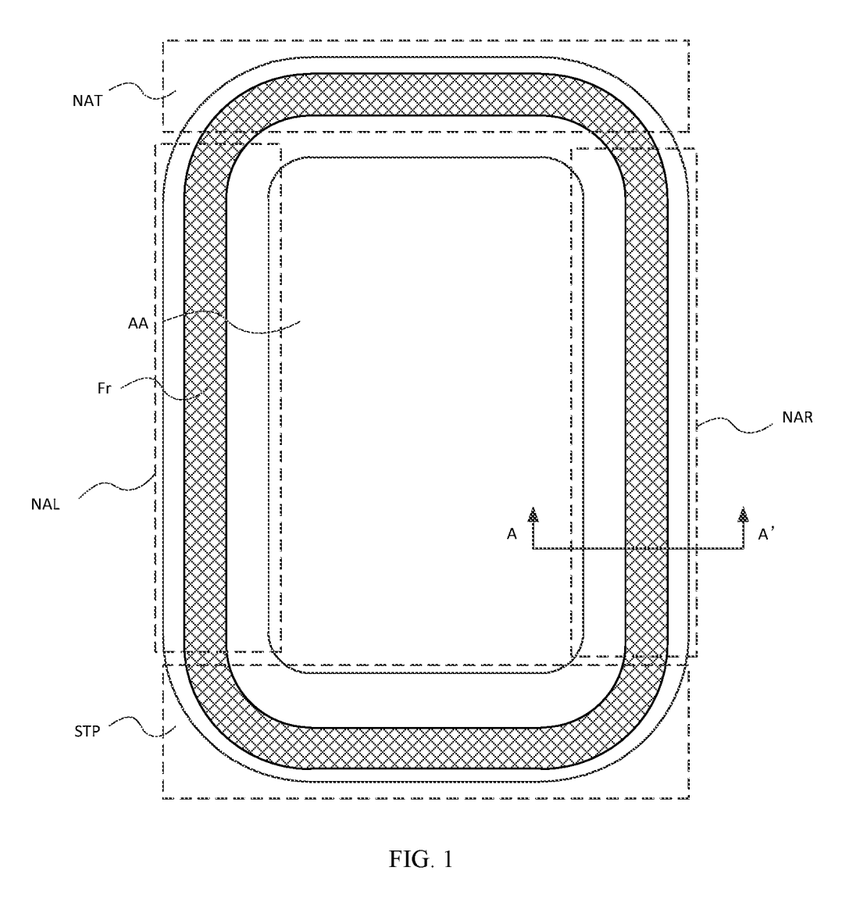
FIG. 1 is a schematic view of a display panel according to an embodiment of the present disclosure.
Figure 2:
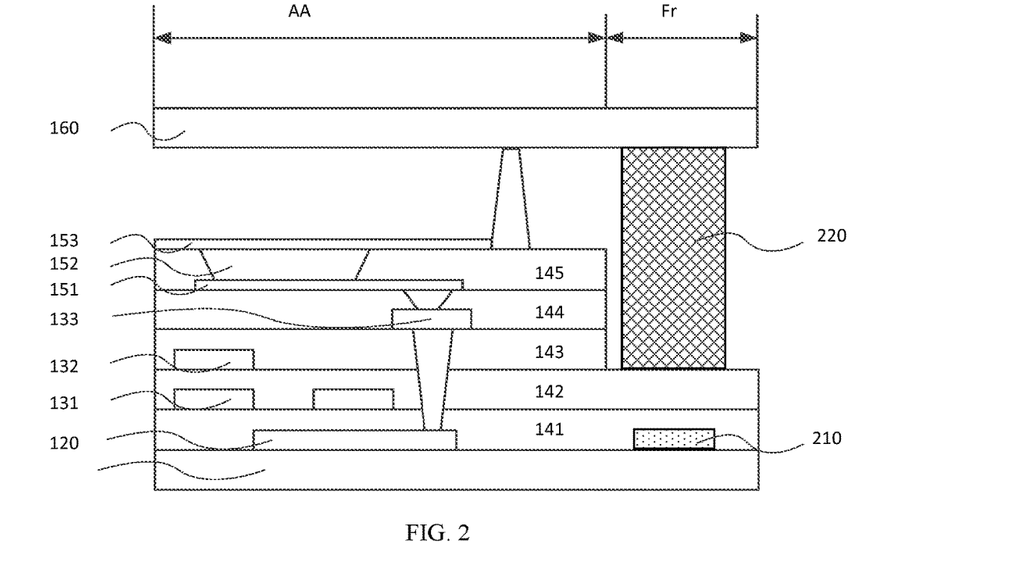
FIG. 2 is a schematic cross-sectional view along line AA' in FIG. 1.
Figure 3:
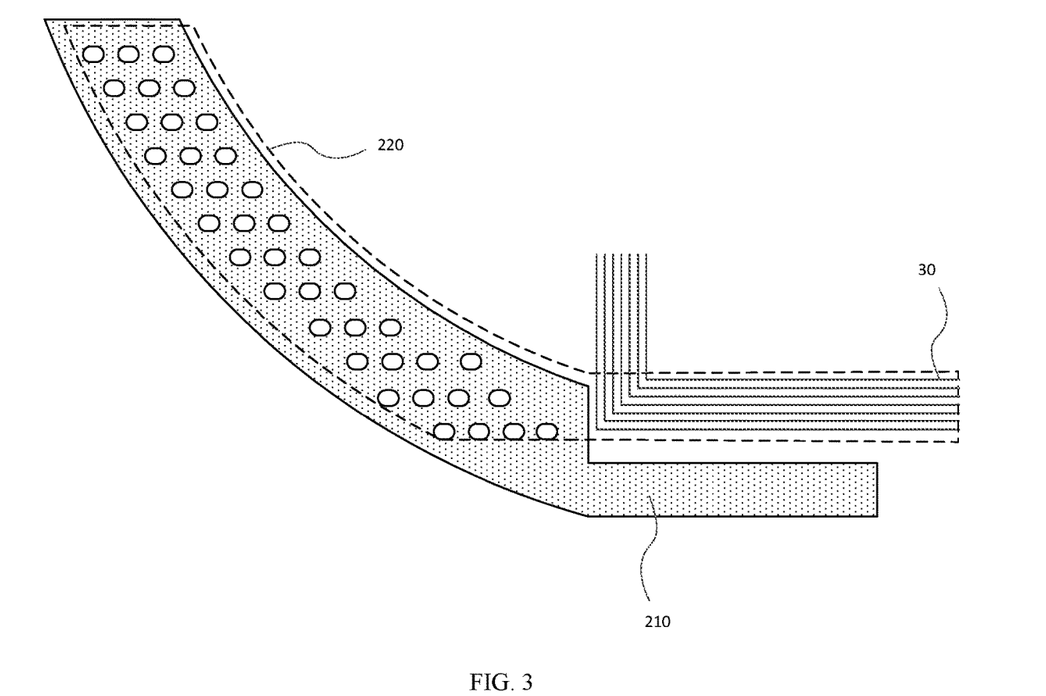
FIG. 3 is a partial enlarged diagram of a lower left corner in FIG. 1.
Figure 4:
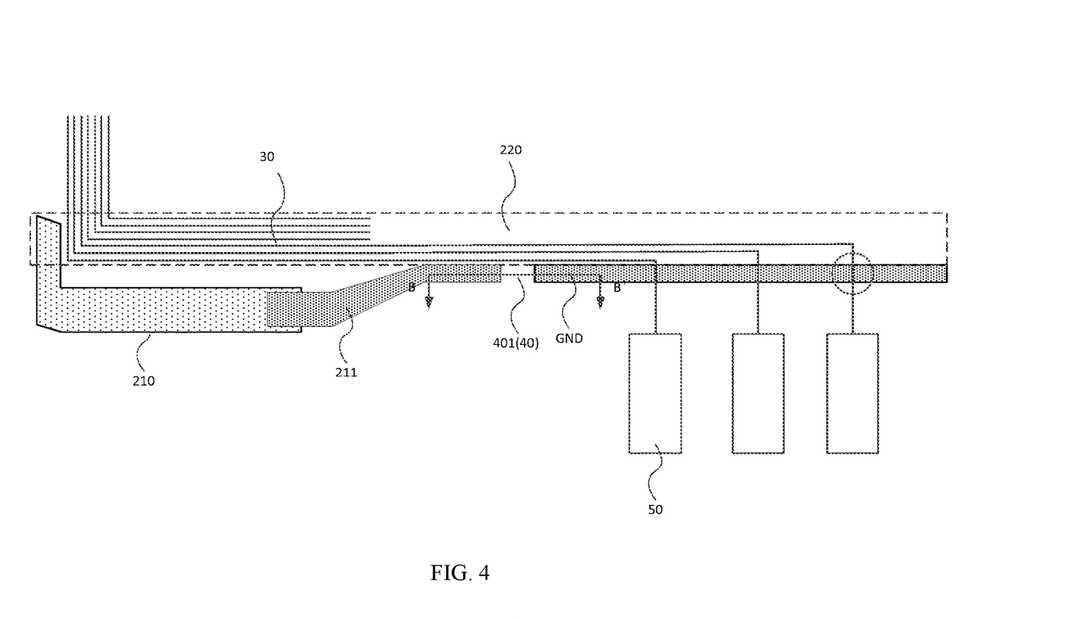
FIG. 4 is a partially enlarged schematic diagram showing a step region of a display panel according to an embodiment of the present disclosure.
Figure 5:
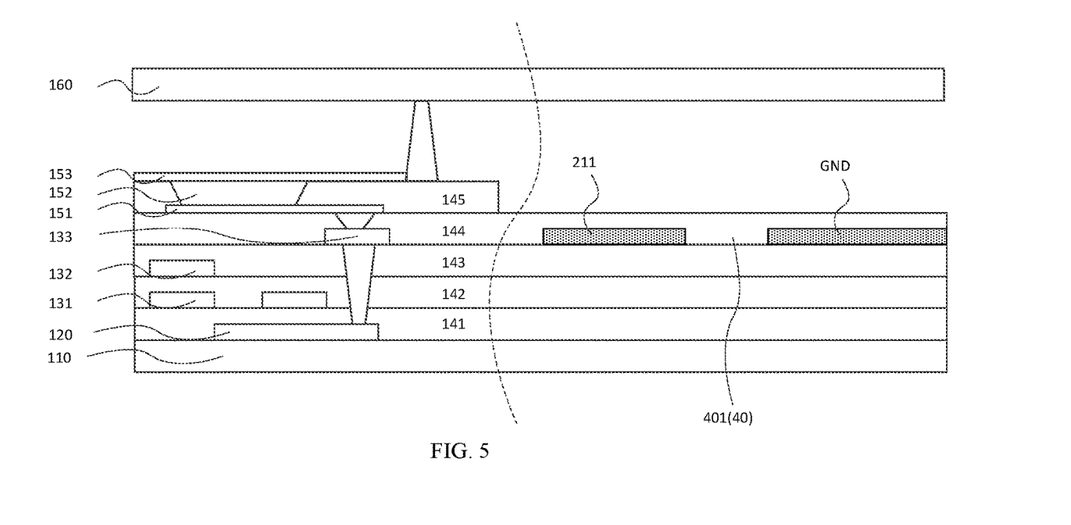
FIG. 5 is a schematic cross-sectional view along line BB' in FIG. 4.

Referring to FIGS. 1-5, FIG. 1 is a schematic view of a display panel according to an embodiment of the present disclosure; FIG. 2 is a schematic cross-sectional view along line AA' in FIG. 1; FIG. 3 is a partial enlarged diagram of a lower left corner in FIG. 1; FIG. 4 is a partially enlarged schematic diagram showing a step region of a display panel according to an embodiment of the present disclosure; and FIG. 5 is a schematic cross-sectional view along line BB' in FIG. 4.

The display panel of the present disclosure includes a display region AA and a non-display region surrounding the display region AA. The non-display region includes a step region STP, a left border NAL and a right border NAR that are adjacent to the step region STP, and an upper border NAT opposite to the step region STP. The left border NAL, the right border NAR, the upper border NAT, and the step region STP surround the display region AA.

The left border NAL and the right border NAR include an encapsulation region Fr. The encapsulation region Fr that is located in the left border NAL and the right border NAR includes a sealant 220 and a reflective metal layer 210. The sealant 220 at least partially overlaps with the reflective metal layer 210. In order to prevent moisture and oxygen from damaging the display panel, the encapsulation region Fr and the sealant 220 are arranged in the non-display region NA of the display panel, and the sealant 220 is generally a frit, which should be laser melted. In order to improve laser utilization and uniformity of melting, it is required to provide a reflection layer to reflect laser light. In addition to the left border NAL and the right border NAR, the encapsulation area Fr that is located in the upper border NAT is also provided with a reflective metal layer 210 and a sealant 210. The encapsulation area Fr located in the step region STP is provided with a sealant 220, but the step region STP does not need to be provided with an additional reflective metal layer. This is because a connection line connected to the test circuit, a fan-out line of a data line and other connection lines connected to binding terminals (or driver chips) together serve as the reflective metal layer. The step region STP further includes a ground metal line GND. The ground metal line GND is connected to the reflective metal layer 210 by an electrostatic consumption resistance portion 40. It should be noted that the ground metal line GND can be connected to a ground potential or a negative electrode potential so as to discharge static electricity.

FIG. 3 is a partial enlarged diagram of a lower left corner in FIG. 1. As shown in FIG. 3, when the display panel having the R corner and the notch silk-screens the frit, since it is required an edging process, a distance from the frit to a cutting edge is generally required to be larger than 120 μm in the R corner region. In this design, most of the R corner regions may shrink the frit inside the frit metal (shown in FIG. 3). The region of the dotted block is the region of the sealant 220. The sealant 220 is shrunk inside the reflective metal layer 210. With reference to FIG. 2, the display panel of the present disclosure includes a substrate 110, an active layer 120, a gate metal layer 131, a capacitor metal layer 132, a source-drain metal layer 133, a light-emitting device and a package substrate 160. The active layer 120, the gate metal layer 131, the capacitor metal layer 132, the source-drain metal layer 133, and the source-drain metal layer 133 are sequentially arranged on the substrate 110, and the light-emitting device is connected to the source-drain metal layer. The light-emitting device includes a first electrode layer 151, a second electrode layer 153, and an organic light-emitting layer 152 between the first electrode layer 151 and the second electrode layer 153. A gate insulation layer 141 is arranged between the active layer 120 and the gate metal layer 131. A first interlayer insulation layer 142 is arranged between the gate metal layer 131 and the capacitor metal layer 132. A second interlayer insulation layer 143 is arranged between the capacitor metal layer 132 and the source-drain metal layer 133. A planarization layer 144 is arranged between the source-drain metal layer 133 and the first electrode layer 151. A pixel definition layer 145 is arranged between the first electrode layer 151 and the second electrode layer 153. Referring to FIG. 3, it can be seen that due to the shrinkage of the sealant 220, a portion of the reflective metal layer 210 only has an inorganic insulation layer, such as the gate insulation layer 141 and/or the first interlayer insulation layer 142. In this case, external static electricity may break down the inorganic insulation layer, and then may be transferred to the reflective metal 210. Referring to FIG. 4, a binding terminal 50 is connected to the test circuit through the connection line 30. The connection line 30 overlaps with the ground metal line GND. When the static electricity is transmitted to the ground metal line GND, the static electricity damages the connection line 30 between the binding terminal 50 and the test circuit. In the display panel of the present disclosure, an electrostatic consumption resistance portion 40 is provided with between the reflective metal layer 220 and the ground metal line GND. In the display panel of the present disclosure, the electrostatic is consumed by the electrostatic consumption resistance portion 40 before being transmitted to the ground metal line GND, thereby avoiding damage the device overlapping with the ground metal line GND.

In one embodiment of the present disclosure, referring to FIGS. 4 and 5, the electrostatic consumption resistance portion 40 includes a disconnection portion 401. The disconnection portion 401 can disconnect the connection line 211 between the ground metal line GND and the reflective metal layer 210 by laser light. The laser disconnection is actually equivalent to a high-resistance resistor connected in series. The static electricity may be re-discharged when encountering high resistance region during a discharging process, so that the static electricity transmitted in subsequent processes is smaller, thus protecting devices that overlap with the ground metal line GND, such as the test circuit. Theoretically, the length of the high-resistance resistor connected in series does not cause significant influence. It should be noted that the length of the disconnection portion 401 is less than or equal to 10 μm along an extending direction of the ground metal line GND. A situation can be avoided where the reflective metal layer 200 is directly disconnected from the ground metal line GND because the disconnection portion 401 is too long.

Figure 6:
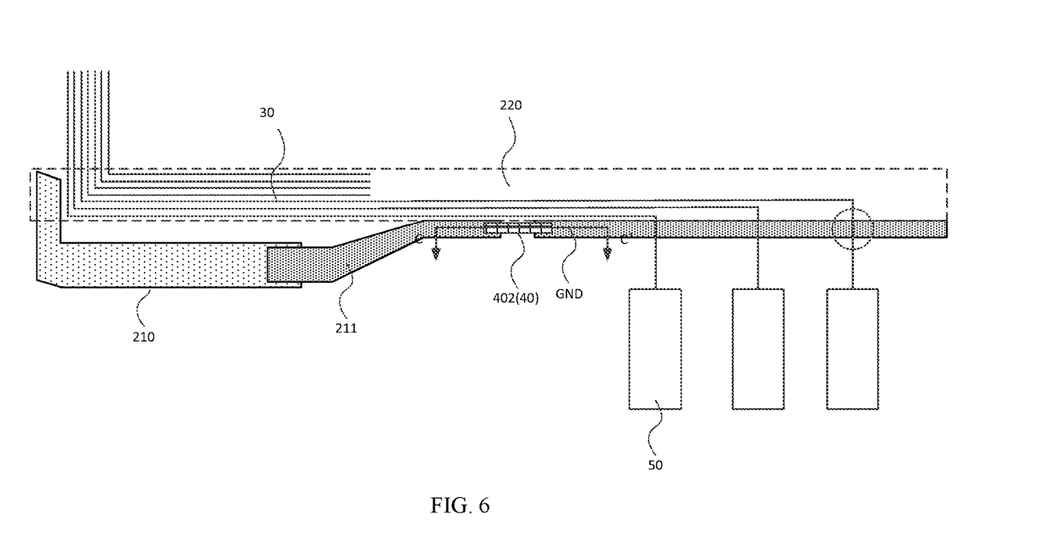
FIG. 6 is a partially enlarged schematic diagram showing a step region of a display panel according to another embodiment of the present disclosure.
Figure 7:
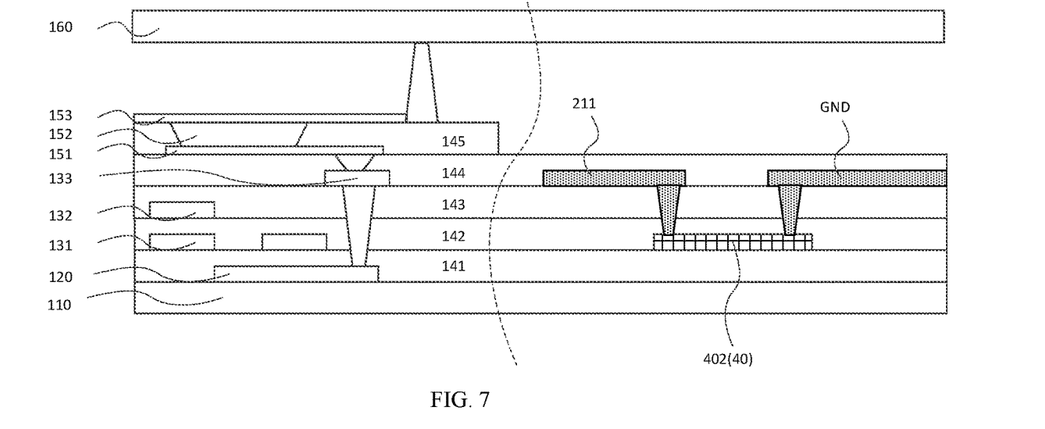
FIG. 7 is a schematic cross-sectional view along line CC' in FIG. 6.

FIG. 6 is a partially enlarged schematic diagram showing a step region of a display panel according to another embodiment of the present disclosure; and FIG. 7 is a schematic cross-sectional view along line CC' in FIG. 6. Referring to FIGS. 6 and 7, since the electrostatic consumption resistance portion can consume part or all of the static electricity as long as a sufficiently large resistance is provided, it is possible to protect the device overlapping with the ground metal line GND. Forming the disconnection portion by laser requires an additional process, and requires a high precision. Therefore, in another embodiment of the present disclosure, the display panel further includes a scan signal line and a data signal line that are intersected with each other (not shown). The scan signal line is located in the gate metal layer. The data signal line is located in the source-drain metal layer. Since the source-drain metal layer 133 is configured to transmit data signals, the sheet resistance of the source-drain metal layer 131 is small in order to reduce the loss of the data signal during transmission. The scan line located in the gate metal layer 131 is only required to satisfy the condition for the transistor to be turned on. The transmitted voltage value is not required to be as accurate as the data signal transmitted by the data signal line. Therefore, the sheet resistance of the gate metal layer 131 is relatively large. In this embodiment, the source-drain metal layer 133 has a smaller sheet resistance than the gate metal layer 131. The electrostatic consumption resistance portion 40 in this embodiment includes a first electrostatic consumption resistance portion 402 located in the gate metal layer 131. It should be noted that the first electrostatic consumption resistance portion 402 may be arranged between a transition portion 211 and the ground wire GND, in which the transition portion 211 is located between the ground wire GND and the reflective metal layer 210. In the present disclosure, the first electrostatic consumption resistance portion 402 having a high resistance is connected in series between the reflective metal layer 210 and the ground metal line GND. The static electricity may be re-discharged when encountering high resistance region during a discharging process, so that the static electricity transmitted in subsequent processes is smaller, thus protecting devices that overlap with the ground metal line GND, such as the test circuit.

Figure 8:
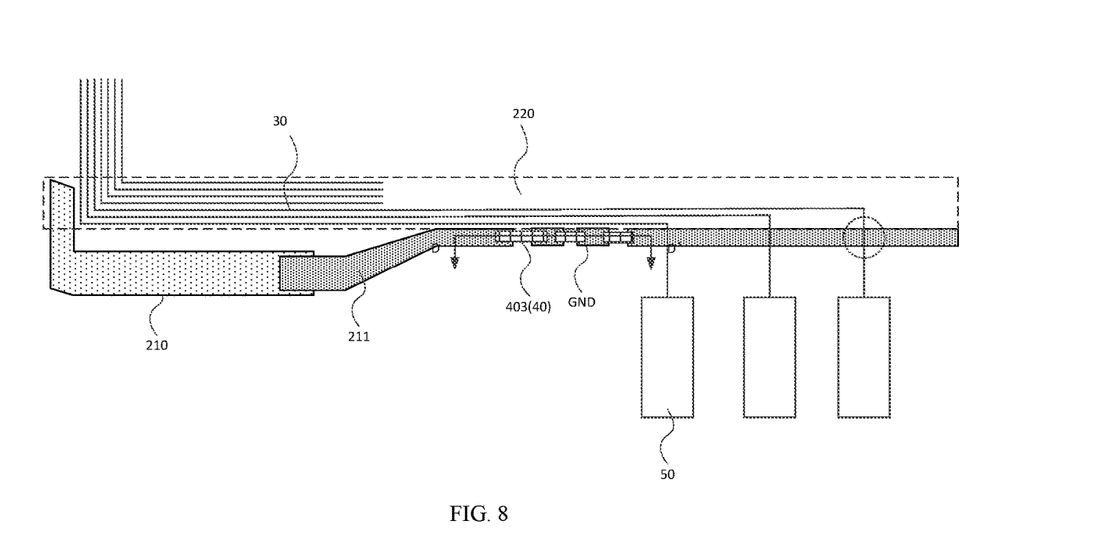
FIG. 8 is a partially enlarged schematic diagram showing a step region of a display panel according to still another embodiment of the present disclosure.
Figure 9:
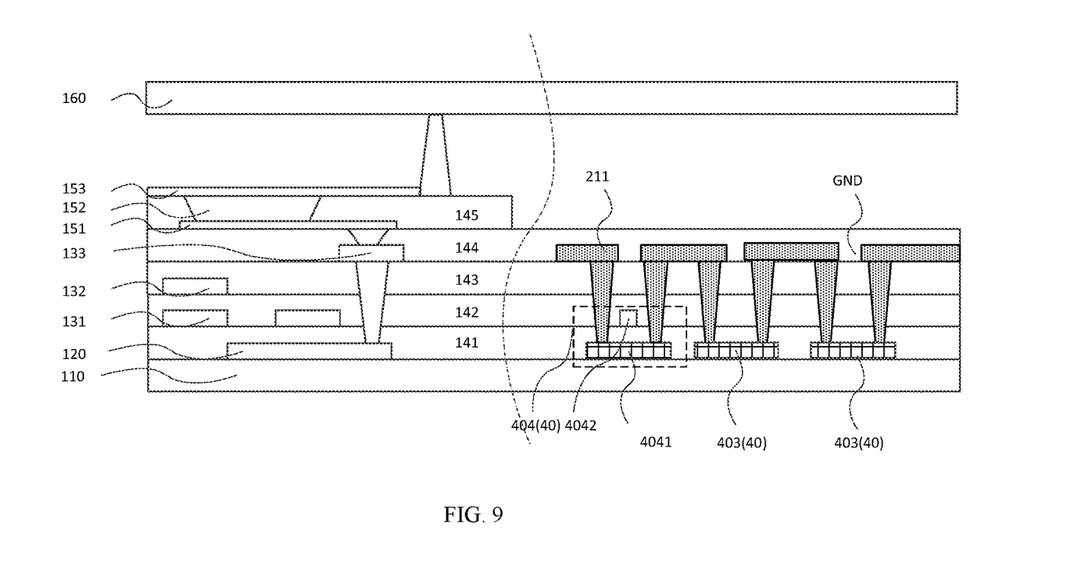
FIG. 9 is a schematic cross-sectional view along line DD' in FIG. 8.

FIG. 8 is a partially enlarged schematic diagram showing a step region of a display panel according to still another embodiment of the present disclosure; and FIG. 9 is a schematic cross-sectional view along line DD' in FIG. 8. In another embodiment of the present disclosure, referring to FIGS. 8 and 9, in order to further increase the resistance of the electrostatic consumption resistance portion 40 without complicating the film layer design of the display panel, the electrostatic consumption resistance portion 40 includes a second electrostatic consumption resistance portion 403 located in the active layer 120. The doping concentration of the second electrostatic consumption resistance portion 403 is less than the doping concentration of the lightly doped region in the active layer 120. In this way, the resistance of the second electrostatic consumption resistance portion 403 can be increased while maintaining electrical conduction.

The second electrostatic consumption resistance portion 403 may be arranged between a transition portion 211 and the ground wire GND, in which the transition portion 211 is located between the ground wire GND and the reflective metal layer 210. In an embodiment, the second electrostatic consumption resistance portion 403 may include an un-doped material of the active layer, so that the static electricity can be consumed as much as possible while maintaining conduction of the static electricity and avoiding the accumulation of the static electricity. Therefore, the static electricity may be re-discharged when encountering high resistance region during a discharging process. In this way, the static electricity transmitted during subsequent processes is smaller, thereby protecting the device that overlaps with the ground metal line GND, such as the test circuit.

Further, referring to FIG. 9, in order to further increase the resistance of the electrostatic consumption resistance portion 40, the electrostatic consumption resistance portion 40 in this embodiment may include an active layer portion 4041 of the active layer and a gate portion 4042 that at least partially overlaps with the active layer portion 4041. The doping concentration of the active layer portion 4041 is smaller than the doping concentration of the lightly doped region in the active layer. The gate portion 4042 and the active layer portion 4041 constitute an electrostatic consumption resistance transistor 404 which applies a first voltage to the gate portion 4042. The first voltage causes the electrostatic consumption resistance transistor 404 to be cut off. For example, if the active layer portion and the gate portion constitute a P-type transistor, a high-level signal is applied to the gate portion to cut off the P-type transistor. The equivalent resistance of the electrostatic consumption resistance portion 40 in this solution is larger compared to the solution without the gate portion, thereby obtaining a better electrostatic discharging effect. In contrast, if the active layer portion and the gate portion constitute an N-type transistor, a low-level signal is applied to the gate portion.

Figure 10:
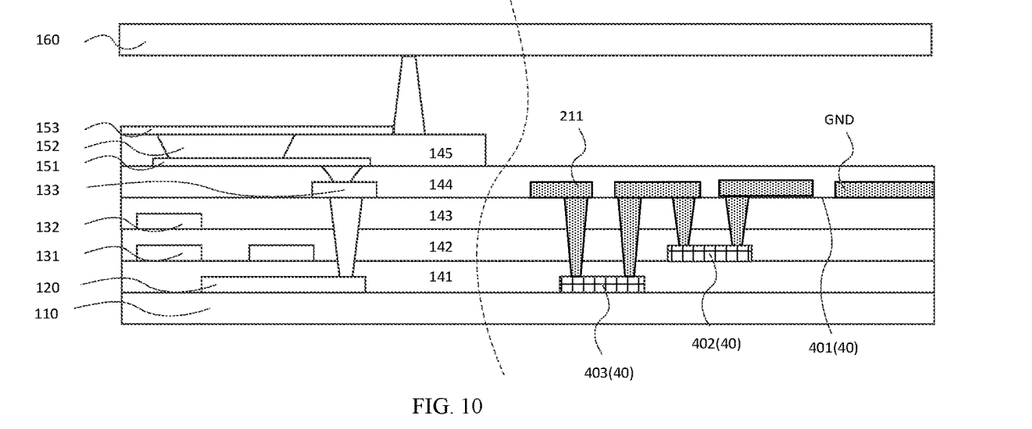
FIG. 10 is another schematic cross-sectional view along line DD' in FIG. 8.

Further, referring to FIG. 10, FIG. 10 is another schematic cross-sectional view along line DD' in FIG. 8.

In the present disclosure, a plurality of sections of the electrostatic consumption resistance portion 40 is arranged in series. They may be a same type of electrostatic consumption resistance portion 40, such as a plurality of sections of the disconnection portions arranged in series; or, a plurality of sections of the first electrostatic consumption resistance portions arranged in series; or, a plurality of sections of the second electrostatic consumption resistance portions arranged in series; or, a plurality of sections of the electrostatic consumption resistance transistors arranged in series. Three or more second electrostatic consumption resistance portions 403 may be arranged in series. The function of the multi-section electrostatic consumption resistance portion 40 is to protect in multiple sections, respectively. If the first section of the electrostatic consumption resistance portion 40 is damaged, the second section of the electrostatic consumption resistance portion 40 performs a secondary protection, so that the static electricity transmitted further has lower intensity, thereby protecting devices that overlap with the ground metal GND, such as the test circuit.

In another embodiment, a plurality of sections of the electrostatic consumption resistance portion arranged in series includes at least two of the disconnection portions, the first electrostatic consumption resistance portion, the second electrostatic consumption resistance portion, and the electrostatic consumption resistance transistor. For example, as shown in FIG. 10, the electrostatic consumption resistance portion 40 may be a combination of the disconnection portion 401, the first electrostatic consumption resistance portion 402, and the second electrostatic consumption resistance portion 403 so as to achieve a better electrostatic discharging effect.

Further, when the plurality of electrostatic consumption resistance sections connected in series includes the first electrostatic consumption resistance portion, the first electrostatic consumption resistance portion is away from the reflective metal layer and close to the ground metal line. For example, when the disconnection portion 401, the second electrostatic consumption resistance portion 403, and the first electrostatic consumption resistance portion 402 are included, the disconnection portion 401 or the second electrostatic consumption resistance portion 403 may be arranged at a position close to the reflective metal layer 210, and the first electrostatic consumption resistance portion 402 is arranged at a position close to the ground metal line GND. In this way, on the one hand, it is possible to avoid the problem that the first electrostatic consumption resistance portion cannot withstand the failure due to the damage of the first electrostatic consumption resistance when a strong static electricity passes through the first electrostatic consumption resistance portion; and on the other hand, the problem of static electricity accumulation due to poor static electricity transmission effect caused by the disconnection portion 401 or the second electrostatic consumption resistance portion 403 can be avoided. Meanwhile, a problem can be avoided where the resistance is not large enough and the static electricity consumption capability is not strong enough caused by the first electrostatic consumption resistance portion 402 connected in series. In this embodiment, the disconnection portion 401 or the second electrostatic consumption resistance portion 403 is arranged at a position close to the reflective metal layer 210, such that a large amount of static electricity can be first consumed. Arranging the first electrostatic consumption resistance portion 402 at a position close to the ground metal line GND can also serve to conduct remaining static electricity after consuming the large amount of static electricity. Otherwise, the first electrostatic consumption resistance portion 402 is easily damaged, resulting in a problem that it is impossible to perform secondary static electricity discharge.

In an embodiment, the order of arrangement of the electrostatic consumption resistance portions is a disconnection portion, an electrostatic consumption resistance transistor, a second electrostatic consumption resistance portion, and a first electrostatic consumption resistance portion in a direction from the reflective metal layer to the ground metal line. In this way, the electrostatic consumption resistance portion close to the reflective metal layer can consume static electricity first.

Figure 11:
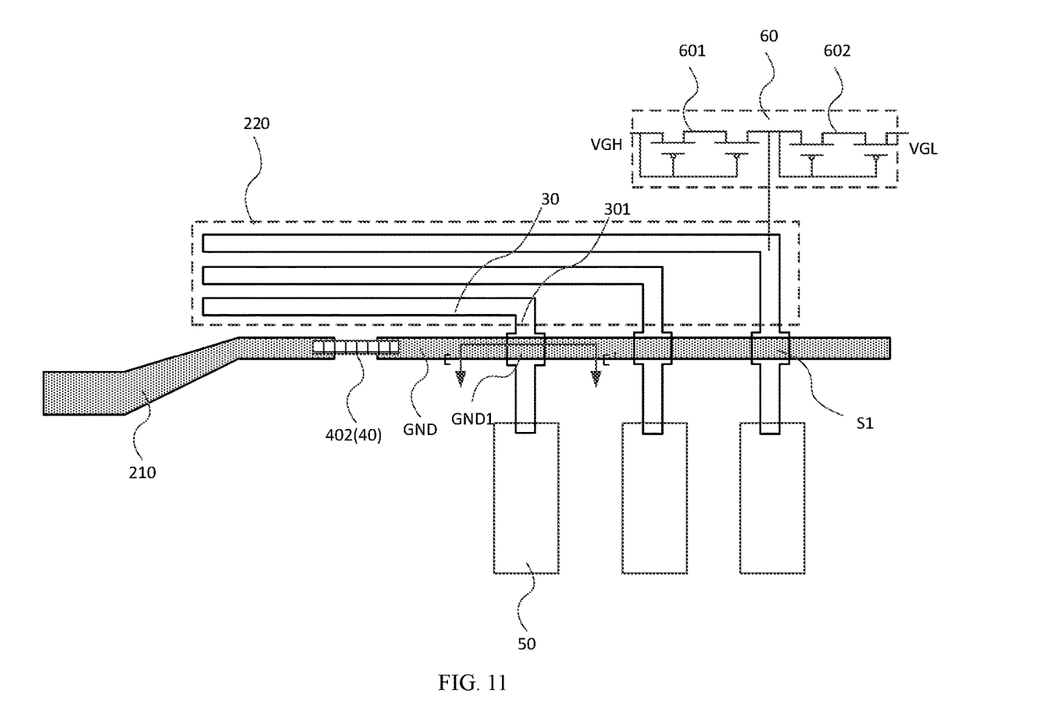
FIG. 11 is a partially enlarged schematic view showing a step region of a display panel according to yet another embodiment of the present disclosure.

Further, referring to FIG. 11, FIG. 11 is a partially enlarged schematic view showing a step region of a display panel according to yet another embodiment of the present disclosure.

The display panel includes a binding terminal 50 and a test circuit (not shown). The binding terminal 50 is electrically connected to the test circuit by the connection line 30. The test circuit is configured to short-circuit the data signal line during the test. In this way, the entire display panel can be illuminated as long as one set of data signals is written, and the display panel can be tested without binding the driver chip.

The connection line 30 at least partially overlaps with the ground metal line GND. The connection line 30 includes a first connection line 301 overlapping with the ground metal line GND. The ground metal line GND includes a first ground metal line GND1 that overlaps with the connection line 30.

When the static electricity that is not consumed by the static electricity consumption portion 40 is transmitted to the ground metal line GND, the static electricity may break down the inorganic layer insulation layer between the first ground metal line GND1 and the first connection wire 301, thereby damaging the first connection wire 301. As a result, the signal of the binding terminal 50 cannot be transmitted to the test circuit, and the display panel cannot be tested.

In order to prevent the first connection line 301 from being damaged by the static electricity that is not consumed by the electrostatic consumption resistance portion 40, the connection line 30 provided in this embodiment includes an overlapping portion overlapping with the ground metal line GND, and a non-overlapping portion that does not overlap with the ground metal line GND. The overlapping portion has a greater width than the non-overlapping portion. Referring to FIG. 11, the overlapping portion of the connection line is the first connection line 301. The connection line 30, except for the first connection line 301, is the non-overlapping portion. Since the width of the binding terminal 50 is much larger than the width of the connecting wire 30, there is sufficient space to arrange the overlapping portion. In the present disclosure, the width of the overlapping portion is larger than the width of the non-overlapping portion, so that the area of the overlapping portion between the connection line 30 and the ground metal line GND is increased. Under the condition with a same static electricity, the amount of static electricity per unit area is small, it is difficult to break down the inorganic insulation layer in the overlapping portion between the connection line 30 and the ground metal line GND, thereby avoiding that the static electricity not consumed by the electrostatic consumption resistance portion 40 damages the device overlapping with the ground metal line GND, and further improving the anti-electrostatic capacity of the display panel. Further, the overlapping area between the ground metal line GND and the first connection line 301 can also be increased by means of widening the ground metal line GND. For example, the width of the ground metal line GND is greater than 80 µm. Further, when the overlapping area between the first ground wire GND1 and the first connecting wire 301 is set to be greater than or equal to 1000 µm², the risk of electrostatic damage can be effectively reduced.

Figure 12:
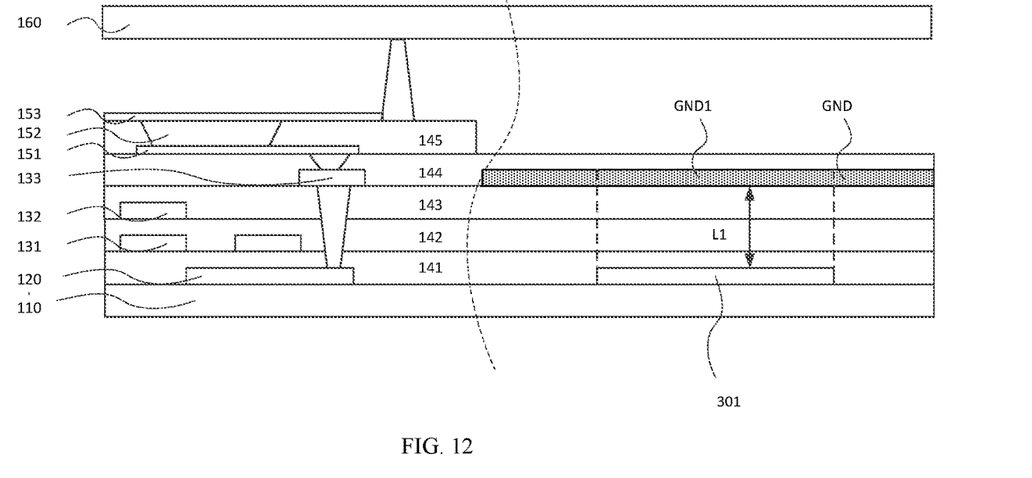
FIG. 12 is a schematic cross-sectional view along line EE' in FIG. 11.

In addition to increasing the overlapping area between the first connection line 301 and the first ground metal line GND1 to reduce the risk of electrostatic damage, increasing the vertical distance between the first connection line 301 and the first ground metal line GND1 may also reduce the risk of breakdown between the connection line 301 and the first ground metal line GND1. Referring to FIG. 12, FIG. 12 is a schematic cross-sectional view along line EE' in FIG. 11.

The first connection line 301 is located in the active layer 120, and has a doping concentration greater than or equal to the doping concentration of the heavily doped region. The heavily doped active layer material has a small resistance, and its electrical conductivity may be equivalent to that of metal. In the present disclosure, the active layer 120 is a conductive layer closest to the substrate 110. Therefore, when the first connection line 301 is arranged in the active layer, the risk of electrostatic breakdown can be reduced by increasing the distance between the first connection line 301 and the first ground metal line GND1. Further, at least two inorganic insulation layers are included between the first ground metal line GND and the first connection line 301.

The inorganic insulation layer has a thickness greater than or equal to 0.6 μm in a direction perpendicular to the display panel. The inventors have found that, when the thickness of the inorganic insulation layer between the first connection line 301 and the first ground metal line GND1 is greater than 0.6 μm, when the accumulated electro-static discharge voltage of ±6 KV (test on the back side edge), the probability that the static electricity after being consumed by the electrostatic consumption resistance portion can still break down the inorganic insulation layer is greatly reduced.

When the display panel includes a capacitor metal layer, a gate insulation layer 141, a first interlayer insulation layer 142, and a second interlayer insulation layer 143 are included between the first connection line 301 and the first ground metal line GND1. The risk of three insulation layers being broken down at the same time due to thickness is greatly reduced. Further, in a direction perpendicular to the display panel, a distance L1 between the first connection line 301 and the first ground metal line GND1 is greater than or equal to 0.6 μm. At this time, the risk is greatly reduced that the inorganic insulation layer between the first connection line 301 and the first ground metal line GND1 is broken down.

In order to further increase the distance between the first connection line 301 and the first ground metal line GND1, one organic insulation layer may be added between the first ground metal line GND1 and the first connection line 301. At least two inorganic insulation layers and one organic insulation layer are included between the first ground wire GND1 and the first connecting wire 301. In a direction perpendicular to the display panel, the distance between the first ground wire GND1 and the first connecting wire 301 is greater than or equal to 1.8 μm.

Figure 13:
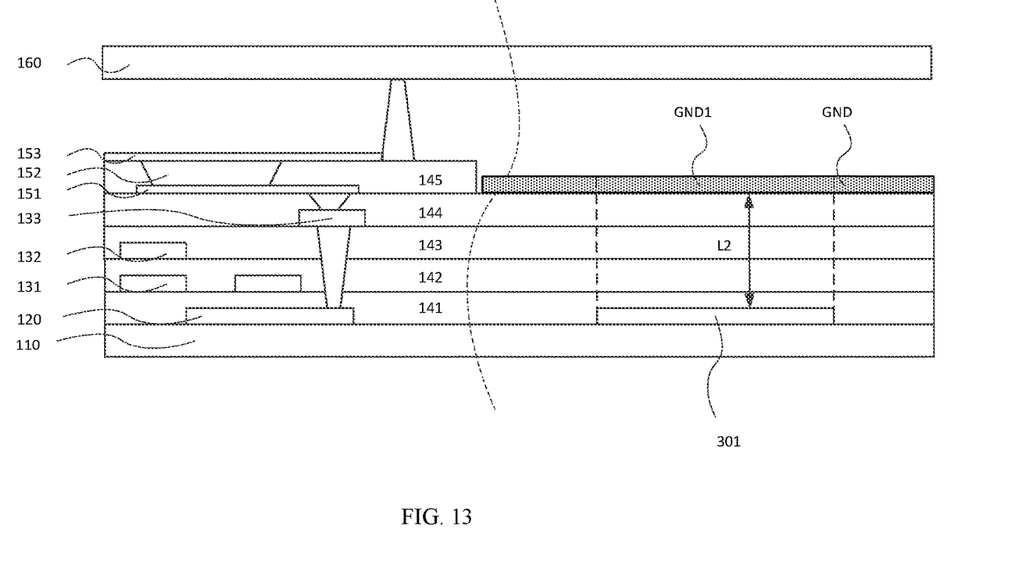
FIG. 13 is another schematic cross-sectional view along line EE' in FIG. 11.

In another embodiment of the present disclosure, in order to further increase the distance between the first connection line 301 and the first ground metal line GND1 without complicating film layers and the processing, the risk of electrostatic breakdown is reduced. FIG. 13 is another schematic cross-sectional view along line EE' in FIG. 11. Referring to FIG. 13, the first ground metal line 301 is located in the first electrode layer 151. The first electrode layer 151 is generally composed of ITO/Ag/ITO (ITO stands for indium tin oxide), and has a relatively small sheet resistance and a strong electrical conductivity, thereby serving as a material of the ground metal line. At this time, the gate insulation layer 141, the first interlayer insulation layer 142, the second interlayer insulation layer 143 and the planarization layer 144 are included between the first connection line 301 and the first ground metal line GND1. The risk of four insulation layers being broken down at the same time due to thickness is greatly reduced. Moreover, the planarization layer is usually composed of an organic material for planarization, and has a much higher thickness than the inorganic insulation layer, thereby greatly reducing the risk of electrostatic breakdown. Further, when at least two inorganic insulation layers and one organic insulation layer are included between the first ground metal line GND1 and the first connection line 301, the distance L2 between the first connection line 301 and the first ground metal line GND1 is greater than or equal to 3 μm in a direction perpendicular to the display panel. Therefore, the probability of electrostatic breakdown is greatly reduced, and the first connection line 301 and the device connected thereto are protected.

Further, referring to FIG. 11, in order to continue to reduce the risk of the display panel being electrostatically damaged, the display panel includes an electrostatic protection device 60 electrically connected to the connection line 30. The electrostatic protection device 60 includes a first diode 601 and a second diode 602. A positive electrode of the first diode 601 is connected to the connection line 30, and a negative electrode of the first diode 601 is connected to the high-level signal line VGH. A negative electrode of the second diode 602 is connected to the connection line 30, and a positive electrode of the second diode 602 is connected to the low-level signal line VGL. In this embodiment, taking a PMOS transistor as a diode as an example, the first diode 601 includes a gate electrode and a drain electrode of the first transistor which are connected to a high-level signal line VGH, and a source electrode of the first transistor which is connected to the connection line 30. The second diode 602 includes a gate electrode and a source electrode of the second transistor which are connected to the connection line 30, and a drain electrode of the second transistor which is connected to a low-level signal line VGL. Under normal conditions without being subjected to static electricity, the gate electrode and drain electrode of the first transistor are connected to a high-level signal, and the signal of the connection line 30 is also within a normal working range, and the first transistor is turned off. Similarly, the gate electrode and the source electrode of the second transistor are connected to the connection line 30, which does not satisfy the condition for the PMOS transistor to be turned on. However, when the connection line 30 is subjected to an extra low-level, the gate potential of the second transistor is much lower than the low-level signal VGL, the second transistor is turned on, and the extra low-level is transmitted to the low-level signal line VGL through the second transistor, thereby achieving electrostatic discharging. When the connection line 30 is subjected to an extra high-level, the gate potential of the first transistor is much lower than the extra high-level, the first transistor is turned on, and the extra high-level is transmitted to the high-level signal line VGH through the first transistor, thereby achieving electrostatic discharging. The extra low-level mentioned here is the static electricity much lower than the signal on the low-level signal line VGL, and the extra high-level is the static electricity much higher than the signal on the high-level signal line VGH. With the electrostatic protection device 60 of the embodiment, static electricity that is not consumed by the electrostatic consumption resistance portion 40 can be discharged, thereby further improving the electrostatic protection performance.

Figure 14:
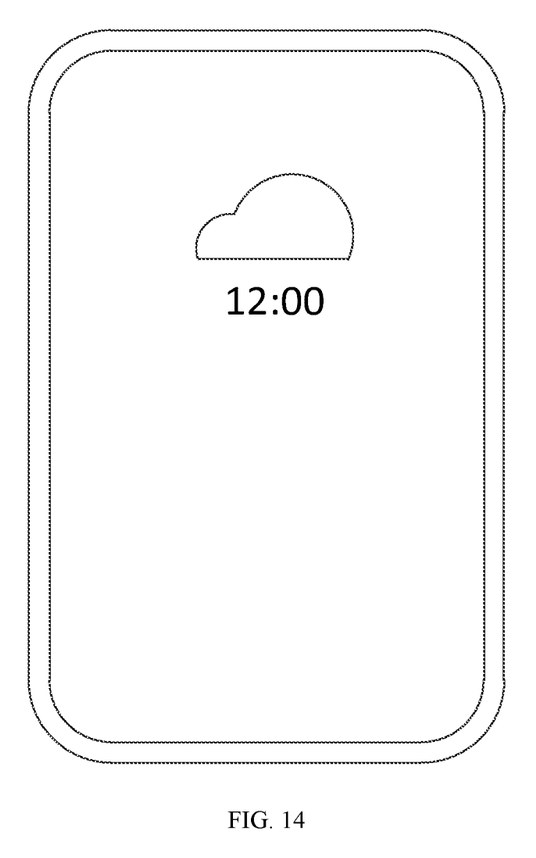
FIG. 14 is a schematic diagram showing a display apparatus according to an embodiment of the present disclosure.

Referring to FIG. 14, FIG. 14 is a schematic diagram showing a display apparatus according to an embodiment of the present disclosure. The present disclosure also provides a display apparatus. The display apparatus of the present disclosure may include a display panel as described above. The display apparatus includes, but is not limited to, a cellular mobile phone, a tablet computer, a display for computers, a display applied on smart wearable devices, a display apparatus applied on vehicles such as automobiles, and the like. As long as the display apparatus includes the display panel disclosed in the present disclosure, it shall fall within the protection scope of the present disclosure.

The above are merely preferred embodiments of the present disclosure, which, as mentioned above, are not used to limit the present disclosure. The embodiments within the principles of the present disclosure, including any modification, equivalent substitution, improvement, etc., shall fall into the protection scope of the present disclosure.

What is claimed is:
1. A display panel, comprising:
a display region and a non-display region surrounding the display region,
wherein the non-display region comprises a step region, a left border and a right border that are adjacent to the step region, and an upper border arranged opposite to the step region, and wherein the left border, the right border, the upper border, and the step region surround the display region;

wherein the left border and the right border each comprise an encapsulation region;

wherein the encapsulation region comprises a sealant and a reflective metal layer that are at least partially overlapped with each other, wherein the reflective metal layer is configured to reflect laser light; and wherein the step region comprises a ground metal line, and wherein the ground metal line is connected to the reflective metal layer through an electrostatic consumption resistance portion, wherein the display panel further comprises:
a substrate, an active layer, a gate insulation layer, a gate metal layer, an interlayer insulation layer, a source-drain metal layer, a planarization layer, a first electrode layer, a pixel definition layer, an organic light-emitting layer, and a second electrode layer that are sequentially stacked; and
a scan signal line located in the gate metal layer and a data signal line located in the source-drain metal layer; wherein the scan signal line intersects with the data signal line, wherein the source-drain metal layer has a smaller sheet resistance than that of the gate metal layer, and wherein the electrostatic consumption resistance portion comprises a second electrostatic consumption resistance portion located in the active layer, and wherein the second electrostatic consumption resistance portion has a smaller doping concentration than a lightly doped region of the active layer.

2. The display panel according to claim 1, wherein the electrostatic consumption resistance portion comprises a disconnection portion.

3. The display panel according to claim 1, wherein the electrostatic consumption resistance portion comprises a first electrostatic consumption resistance portion located at the gate metal layer.

4. The display panel according to claim 1, wherein the electrostatic consumption resistance portion comprises:
an active layer portion and a gate portion, wherein the active layer portion is located in the active layer and has a smaller doping concentration than a lightly doped region of the active layer;
and wherein the gate portion at least partially overlaps with the active layer portion, wherein the gate portion and the active layer portion constitute an electrostatic consumption resistance transistor, and wherein a first voltage, when applied to the gate portion, cuts off the electrostatic consumption resistance transistor.

5. The display panel according to claim 1, wherein a plurality of sections of the electrostatic consumption resistance portions is arranged in series.

6. The display panel according to claim 5, wherein:
a plurality of sections of the disconnection portions is arranged in series; or, a plurality of sections of the first electrostatic consumption resistance portions is arranged in series; or, a plurality of sections of the second electrostatic consumption resistance portions is arranged in series; or, a plurality of sections of the electrostatic consumption resistance transistors is arranged in series.

7. The display panel according to claim 5, wherein the plurality of sections of the electrostatic consumption resistance portion arranged in series comprises at least two of the disconnection portion, the first electrostatic consumption resistance portion, the second electrostatic consumption resistance portion, and the electrostatic consumption resistance transistor.

8. The display panel according to claim 7, wherein:
the first electrostatic consumption resistance portion is away from the reflective metal layer and close to the ground metal line when the plurality of sections of the electrostatic consumption resistance portion connected in series comprises the first electrostatic consumption resistance portion.

9. The display panel according to claim 1, further comprising:
a binding terminal and a test circuit which are electrically connected through a connection line;
wherein the test circuit is configured to short-circuit the data signal line during test;
wherein the connection line at least partially overlaps with the ground metal line; and
wherein the connection line comprises a first connection line overlapping with the ground metal line, and wherein the ground metal line comprises a first ground metal line overlapping with the connection line.

10. The display panel according to claim 9, wherein:
the connection line comprises an overlapping portion overlapping with the ground metal line and a non-overlapping portion that does not overlap with the ground metal line, the overlapping portion having a greater width than the non-overlapping portion.

11. The display panel according to claim 9, further comprising:
an electro-static discharge protection device electrically connected to the connection line, wherein the electrostatic discharge protection device comprises a first diode and a second diode;
wherein a positive electrode of the first diode is connected to the connection line, and a negative electrode of the first diode is connected to a high-level signal line; and
wherein a negative electrode of the second diode is connected to the connection line, and a positive electrode of the second diode is connected to a low-level signal line.

12. The display panel according to claim 9 wherein:
the first connection line is located in the active layer and has a doping concentration greater than or equal to a doping concentration of a heavily doped region;
and wherein at least the gate insulation layer, a first interlayer insulation layer and a second interlayer insulation layer are arranged in a direction perpendicular to the display panel.

13. The display panel according to claim 12, wherein the first ground metal line is located in the first electrode layer;
and wherein at least the gate insulation layer, the first interlayer insulation layer, the second interlayer insulation layer, and the planarization layer are arranged between the first connection line and the first ground metal line in the direction perpendicular to the display panel.

14. The display panel according to claim 9, wherein:
at least two inorganic insulation layers and one organic insulation layer are arranged between the first ground metal line and the first connection line, and a distance between the first ground metal line and the first connection line is greater than or equal to 1.8 μm in a direction perpendicular to the display panel.

15. A display apparatus, comprising a display panel, wherein the display panel comprises:

a display region and a non-display region surrounding the display region,
wherein the non-display region comprises a step region, a left border and a right border that are adjacent to the step region, and an upper border arranged opposite to the step region; wherein the left border, the right border, the upper border, and the step region surround the display region;
wherein the left border and the right border each comprise an encapsulation region; wherein the encapsulation region comprises a sealant and a reflective metal layer that are at least partially overlapped with each other, the reflective metal layer is configured to reflect laser light; and
wherein the step region comprises a ground metal line, and the ground metal line is connected to the reflective metal layer through an electrostatic consumption resistance portion,
wherein the display panel further comprises:
   a substrate, an active layer, a gate insulation layer, a gate metal layer, an interlayer insulation layer, a source-drain metal layer, a planarization layer, a first electrode layer, a pixel definition layer, an organic light-emitting layer, and a second electrode layer that are sequentially stacked; and
   a scan signal line located in the gate metal layer and a data signal line located in the source-drain metal layer; the scan signal line intersecting with the data signal line;
wherein the source-drain metal layer has a smaller sheet resistance than the gate metal layer, and
wherein the electrostatic consumption resistance portion comprises a second electrostatic consumption resistance portion located in the active layer, and wherein the second electrostatic consumption resistance portion has a smaller doping concentration than a lightly doped region of the active layer.

16. The display apparatus according to claim 15, wherein the electrostatic consumption resistance portion comprises an active layer portion and a gate portion, wherein the active layer portion is located in the active layer and has a smaller doping concentration than a lightly doped region of the active layer;
wherein the gate portion at least partially overlaps with the active layer portion, wherein the gate portion and the active layer portion constitute an electrostatic consumption resistance transistor, and wherein the gate portion is applied with a first voltage to cut off the electrostatic consumption resistance transistor.

* * * * *